United States Patent
Yamamoto et al.

(10) Patent No.: US 9,509,275 B2
(45) Date of Patent: Nov. 29, 2016

(54) QUARTZ VIBRATING DEVICE WITH CONDUCTIVE ADHESIVE LAYERS HAVING SPECIFIC BONDING SURFACE AREA

(71) Applicant: Murata Manufacturing Co., Ltd., Nagaokakyo-shi, Kyoto-fu (JP)

(72) Inventors: Hiroyuki Yamamoto, Nagaokakyo (JP); Masaru Asai, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 0 days.

(21) Appl. No.: 14/833,559

(22) Filed: Aug. 24, 2015

(65) Prior Publication Data

US 2015/0365068 A1    Dec. 17, 2015

Related U.S. Application Data

(63) Continuation of application No. PCT/JP2014/050428, filed on Jan. 14, 2014.

(30) Foreign Application Priority Data

Mar. 7, 2013  (JP) .................................. 2013-045680

(51) Int. Cl.

| H03H 9/19 | (2006.01) |
|---|---|
| H03H 9/10 | (2006.01) |
| H03H 9/09 | (2006.01) |
| H01L 41/047 | (2006.01) |
| H03H 9/13 | (2006.01) |

(52) U.S. Cl.
CPC .......... *H03H 9/1021* (2013.01); *H01L 41/047* (2013.01); *H03H 9/09* (2013.01); *H03H 9/19* (2013.01); *H03H 9/132* (2013.01)

(58) Field of Classification Search
CPC .... H03H 9/19; H03H 9/1021; H03H 9/1042; H03H 9/1071
USPC .................................................. 310/344, 348
See application file for complete search history.

(56) References Cited

U.S. PATENT DOCUMENTS

| 2004/0036380 A1* | 2/2004 | Oda .................. H03H 9/19 310/311 |
|---|---|---|
| 2004/0135474 A1* | 7/2004 | Koyama .............. H03H 9/1021 310/348 |
| 2010/0192340 A1 | 8/2010 | Tashiro et al. |

(Continued)

FOREIGN PATENT DOCUMENTS

| JP | H03-175713 A | 7/1991 |
|---|---|---|
| JP | 2001-077651 A | 3/2001 |

(Continued)

OTHER PUBLICATIONS

International Search Report issued for PCT/JP2014/050428, mail date Apr. 22, 2014.
Written Opinion of the International Searching Authority issued for PCT/JP2014/050428, date of mailing Apr. 22, 2014.

*Primary Examiner* — J. San Martin
(74) *Attorney, Agent, or Firm* — Arent Fox LLP

(57) ABSTRACT

A quartz vibrating device that includes a quartz vibrator supported upon a case board in a cantilever state. The quartz vibrator is electrically connected to first and second mount electrodes by first and second conductive adhesive layers. A total S (mm$^2$) of bonding surface areas of portions bonding the quartz vibrator to the case board by the first and second conductive adhesive layers is in a range of S≤−0.001t+0.22 when a thickness of a quartz substrate is t (μm).

13 Claims, 4 Drawing Sheets

(56) References Cited

U.S. PATENT DOCUMENTS

2012/0242193 A1* 9/2012 Shimao .................... H03H 9/19
                                                            310/348
2012/0242195 A1* 9/2012 Shimao ................ H03H 9/1021
                                                            310/365
2016/0027990 A1* 1/2016 Yamamoto ............... H03H 9/19
                                                            310/344

FOREIGN PATENT DOCUMENTS

| JP | 2002-100950 A | 4/2002 |
| --- | --- | --- |
| JP | 2005-197957 A | 7/2005 |
| JP | 2006-211089 A | 8/2006 |
| JP | 2009-188484 A | 8/2009 |
| JP | 2010-178184 A | 8/2010 |
| JP | 2011-182155 A | 9/2011 |
| JP | 2013-027003 A | 2/2013 |

* cited by examiner

QUARTZ VIBRATING DEVICE WITH CONDUCTIVE ADHESIVE LAYERS HAVING SPECIFIC BONDING SURFACE AREA

CROSS REFERENCE TO RELATED APPLICATIONS

The present application is a continuation of International application No. PCT/JP2014/050428, filed Jan. 14, 2014, which claims priority to Japanese Patent Application No. 2013-045680, filed Mar. 7, 2013, the entire contents of each of which are incorporated herein by reference.

FIELD OF THE INVENTION

The present invention relates to quartz vibrating devices that use quartz vibrators, and particularly relates to quartz vibrating devices in which a quartz vibrator is mounted on a case board using a conductive adhesive.

BACKGROUND OF THE INVENTION

Quartz vibrating devices that use quartz vibrators have conventionally been widely used as oscillators and the like. For example, Patent Document 1, indicated below, discloses a piezoelectric device in which a quartz vibrator is supported in a cantilever state relative to a base board. This quartz vibrator has a configuration that uses an AT cut quartz vibrating piece whose primary vibration is thickness shear vibration. This quartz vibrator is affixed to the base board by a support mount. The support mount is formed from an epoxy resin, a silicone resin, or the like.

Meanwhile, Patent Document 2, indicated below, discloses a piezoelectric device that uses a quartz vibrator. In this piezoelectric device, a substrate, a seal ring, and a cover made of a metal are provided, and the quartz vibrator is sealed within a package. This quartz vibrator is supported on the substrate in a cantilever state. The quartz vibrator is bonded to the substrate using a conductive adhesive. Patent Document 2 describes a specific range for the conductive adhesive in a width direction dimension of the quartz vibrator.

Patent Document 1: Japanese Unexamined Patent Application Publication No. 2011-182155

Patent Document 2: Japanese Unexamined Patent Application Publication No. 2001-77651

SUMMARY OF THE INVENTION

According to the piezoelectric device disclosed in Patent Document 1, the support mount is formed from an epoxy resin, a silicone resin, or the like. However, an equivalent series resistance (ESR) degrades depending on the surface area of the support mount.

Meanwhile, although Patent Document 2 discusses the conductive adhesive in the width direction dimension of the quartz vibrator, no mention is made of a dimension in a longer side direction of the quartz vibrator. Furthermore, the piezoelectric device disclosed in Patent Document 2 has had a risk of vibrations being dampened depending on how the conductive adhesive for bonding the quartz vibrator is applied. In other words, favorable vibration characteristics cannot be achieved with certainty.

It is an object of the present invention to provide a quartz vibrating device in which it is difficult for a conductive adhesive to cause degradation in ESR characteristics.

A quartz vibrating device according to the present invention includes a case board, first and second mount electrodes, a quartz vibrator, and first and second conductive adhesive layers. The first and second mount electrodes are formed on a top surface of the case board. The quartz vibrator is mounted upon the case board and is formed of an AT cut quartz substrate. The first and second conductive adhesive layers electrically connect the quartz vibrator to the first and second mount electrodes and support the quartz vibrator in a cantilever state. A total S (mm$^2$) of bonding areas of portions bonding the quartz vibrator to the case board by the first and second conductive adhesive layers is in a range of $S \leq -0.001t+0.22$ when a thickness of the quartz substrate is taken as t (µm).

According to a specific aspect of the quartz vibrating device of the present invention, the quartz substrate that constitutes the quartz vibrator is supported in a cantilever state at one end side in a lengthwise direction thereof, and the lengthwise direction corresponds to an X-axis direction of the quartz. In the case where the X-axis direction is the lengthwise direction, the quartz vibrator is supported in a cantilever state on a short side thereof. Although the support structure has a great influence of vibration restrictions in such a case, according to the present invention, degradation of ESR characteristics can be effectively suppressed.

According to another specific aspect of the quartz vibrating device of the present invention, the conductive adhesive layers are formed from an epoxy resin-based adhesive having an epoxy resin and a conductive material dispersed throughout the epoxy resin. In this case, the quartz vibrator can be rigidly mechanically supported by the case board.

According to still another specific aspect of the quartz vibrating device of the present invention, the quartz vibrator includes a first exciting electrode provided on a top surface of the quartz substrate, a second exciting electrode provided on a bottom surface so as to overlap with the first exciting electrode, and first and second terminal electrodes electrically connected to the first and second exciting electrodes, respectively, and provided on the bottom surface of the quartz substrate.

According to the quartz vibrating device of the present invention, the bonding surface area S is within the stated specific range, and thus degradation of ESR characteristics can be effectively suppressed. Accordingly, a quartz vibrating device having favorable characteristics can be provided.

DETAILED DESCRIPTION OF THE PREFERRED EMBODIMENTS

The present invention will be made clear hereinafter through descriptions of a specific embodiment of the present invention with reference to the drawings.

Figure 1:
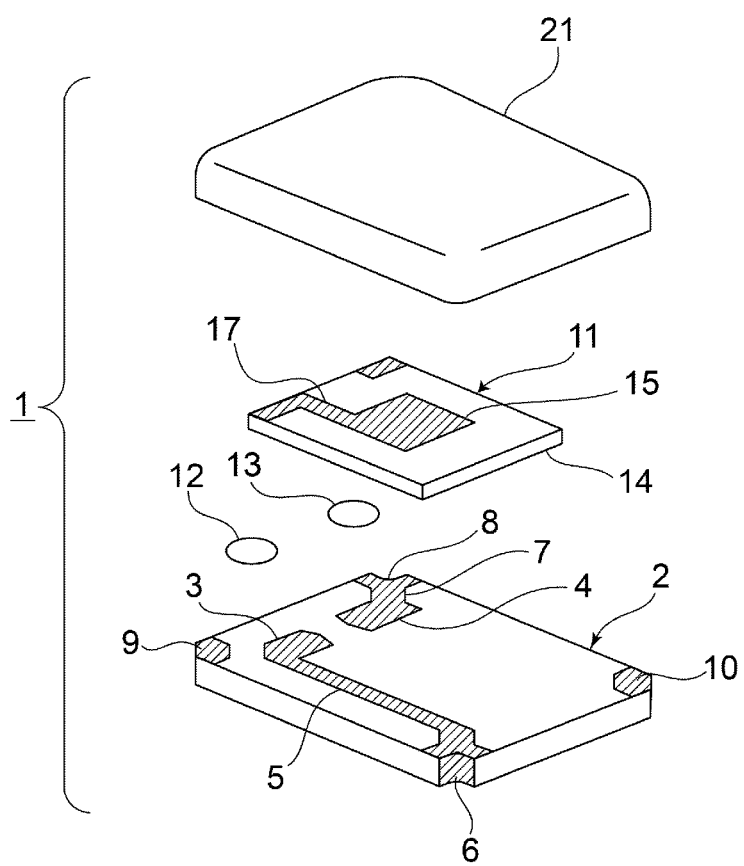
FIG. 1 is an exploded perspective view of a quartz vibrating device according to an embodiment of the present invention.

FIG. 1 is an exploded perspective view of a quartz vibrating device according to an embodiment of the present invention. A quartz vibrating device 1 includes a case board 2. The case board 2 is formed of a suitable insulative material. An insulative ceramic material such as alumina, a synthetic resin, and the like can be given as examples of such an insulative material.

First and second mount electrodes 3 and 4 are formed on a top surface of the case board 2. The first mount electrode 3 is extended to one corner portion of the case board 2 using a wire electrode 5. A first outer electrode 6 is formed in this corner portion. The first outer electrode 6 is provided in an inner circumferential surface of a recessed portion that is provided by cutting out the corner portion.

On the other hand, the second mount electrode 4 is electrically connected to a second outer electrode 8 by a wire electrode 7. The second outer electrode 8 is provided in a corner portion located at the opposite corner to the corner portion in which the first outer electrode 6 is formed.

Dummy electrodes 9 and 10 that are grounded are formed in the remaining two corner portions.

The stated first and second mount electrodes 3 and 4, wire electrodes 5 and 7, first and second outer electrodes 6 and 8, and dummy electrodes 9 and 10 are formed from a suitable metal such as Al, Cu, or the like, or an alloy thereof.

A quartz vibrator 11 is bonded to the top of the case board 2 by first and second conductive adhesive layers 12 and 13.

Figure 2A:
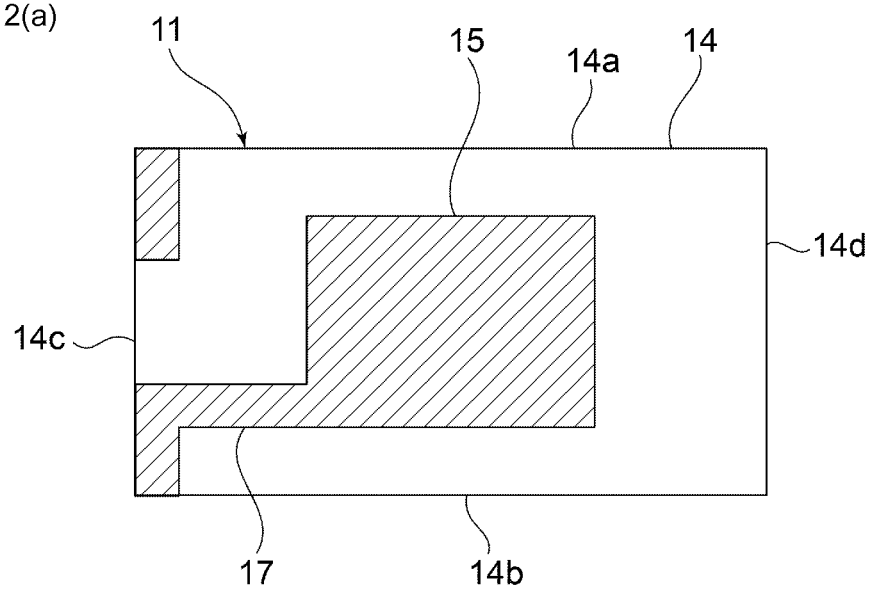
FIG. 2(a) and FIG. 2(b) are a plan view and a schematic plan view illustrating a quartz vibrator used in a quartz vibrating device according to an embodiment of the present invention and a bottom surface electrode thereof.
Figure 2B:
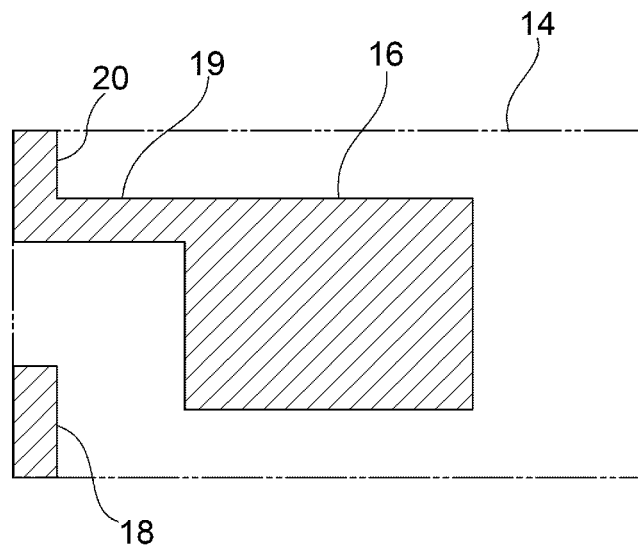

As illustrated in FIGS. 2(a) and 2(b), the quartz vibrator 11 has an AT cut quartz substrate 14. The AT cut quartz substrate 14 has a rectangular plate-shape having a lengthwise direction. In the present embodiment, the lengthwise direction is taken as an X-axis direction of the quartz.

A first exciting electrode 15 is formed on a top surface of the quartz substrate 14. A second exciting electrode 16 is formed on a bottom surface of the quartz substrate 14. The first exciting electrode 15 and the second exciting electrode 16 are disposed so as to overlap with each other with the quartz substrate 14 interposed therebetween. The first and second exciting electrodes 15 and 16 are formed in a center of the top surface and the bottom surface of the quartz substrate 14. As such, an energy-confined vibrating portion is formed using the first and second exciting electrodes 15 and 16.

As shown in FIG. 2(a), a planar shape of the quartz substrate 14 has a pair of mutually-opposing long sides 14a and 14b and a pair of mutually-opposing short sides 14c and 14d.

The first exciting electrode 15 is connected to an extension electrode 17. The extension electrode 17 is extended to a corner portion formed by the short side 14c and the long side 14b. The extension electrode 17 is electrically connected to a first terminal electrode 18 as indicated in FIG. 2(b). In other words, at the corner portion of the quartz substrate 14, the extension electrode 17 extends to the bottom surface along a side surface on the short side 14c and is electrically connected to the first terminal electrode 18 provided on the bottom surface.

The second exciting electrode 16 is connected to an extension electrode 19 provided on the bottom surface of the quartz substrate 14. The extension electrode 19 is electrically connected to a second terminal electrode 20 provided at a corner portion formed by the short side 14c and the long side 14a. The first and second terminal electrodes 18 and 20 are located on both sides of the short side 14c on the bottom surface of the quartz substrate 14.

The first and second exciting electrodes 15 and 16, extension electrodes 17 and 19, and first and second terminal electrodes 18 and 20 are also formed from a suitable metal such as Al, Cu, or the like, or an alloy thereof.

Returning to FIG. 1, in the quartz vibrator 11, the first and second terminal electrodes 18 and 20 illustrated in FIG. 2(b) are electrically connected and mechanically bonded to the first and second mount electrodes 3 and 4 with the first and second conductive adhesive layers 12 and 13 therebetween. Accordingly, the quartz vibrator 11 is supported in a cantilever state at one end side in the lengthwise direction.

The conductive adhesive layers 12 and 13 are in the present embodiment formed from an epoxy resin-based adhesive having an epoxy resin and a conductive material such as a metal powder dispersed throughout the epoxy resin. An epoxy resin-based adhesive has a high hardness when in a solidified state. Accordingly, the quartz vibrator 11 can be more rigidly supported in the cantilever state.

However, in the present invention, the material from which the conductive adhesive layers are formed is not limited to an epoxy resin-based adhesive, and a synthetic resin aside from an epoxy resin, such as a silicone resin, a polyimide resin, or the like may be used instead. Furthermore, although a thermosetting resin is preferable as the synthetic resin, a resin aside from a thermosetting resin may be used. In addition, a suitable conductive material aside from a metal powder, such as carbon powder or the like, can be used for the conductive material that is dispersed.

The quartz vibrating device 1 has a feature that when a thickness of the quartz substrate 14 is expressed as t (μm), a bonding surface area S realized by the first and second conductive adhesive layers 12 and 13 is in a range of S (mm²)≤−0.001t+0.22. ESR damping can be effectively suppressed as a result. This will be described with reference to FIG. 3 to FIG. 6.

Figure 3:
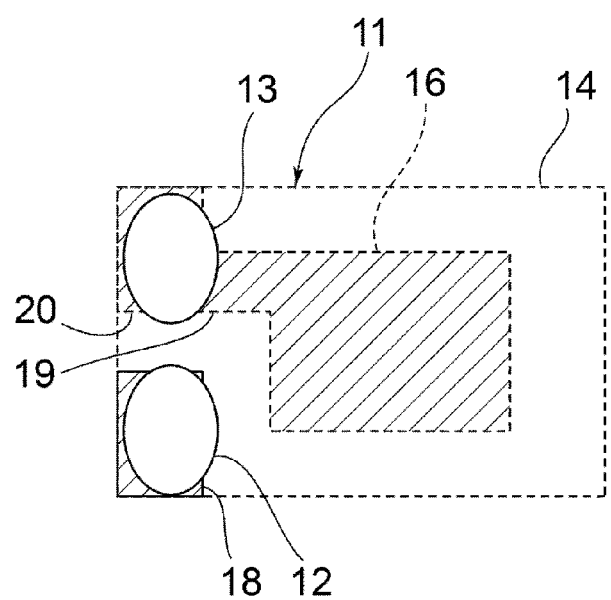
FIG. 3 is a schematic plan view for explaining a bonding surface area S according to an embodiment of the present invention.

FIG. 3 is a schematic plan view for explaining the bonding surface area S. Here, the quartz vibrator 11 is indicated by a broken line. The aforementioned first and second conductive adhesive layers 12 and 13 are bonded to the bottom surface of the quartz vibrator 11. A total of bonding surface areas of the portions bonding the quartz substrate 14 and the case board 2 by the conductive adhesive layers 12 and 13 is represented by S (mm²). In other words, when a bonding surface area of the conductive adhesive layer 12 is represented by S1 and a bonding surface area of the conductive adhesive layer 13 is represented by S2, S=S1+S2.

Note that one or more third conductive adhesive layers may be further provided in addition to the first and second conductive adhesive layers 12 and 13, as long as the cantilever support is achieved. In this case, when the bonding surface area of the third conductive adhesive layer is represented by S3, S=S1+S2+S3. In this manner, one or more third conductive adhesive layers may further be provided as long as the cantilever state can be maintained.

As a result of various investigations regarding the quartz vibrating device 1, the inventors of the present invention have found that ESR damping can be effectively suppressed by keeping the bonding surface area S within a specific range. The present invention was conceived based on such new knowledge obtained by the inventors of the present invention.

Figure 4:
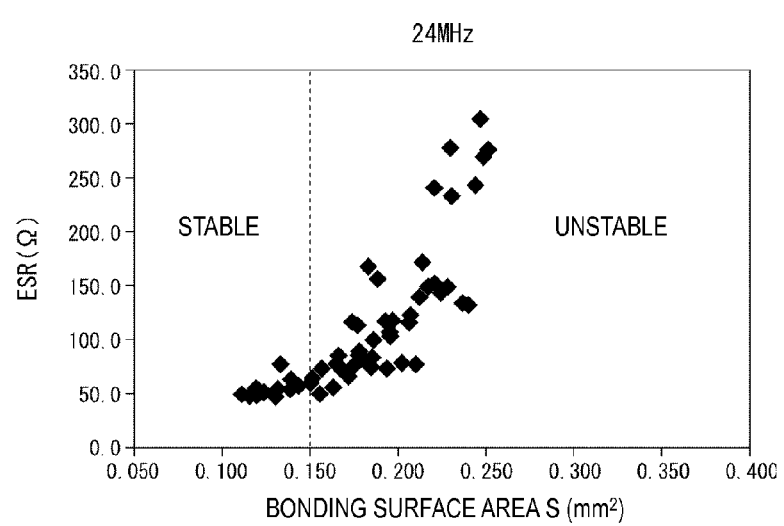
FIG. 4 is a diagram illustrating a relationship between a bonding surface area S and an equivalent series resistance ESR in a quartz vibrating device having an oscillation frequency in a 24 MHz band.

FIG. 4 is a diagram illustrating changes in ESR when the quartz vibrating device 1 having an oscillation frequency of 24 MHz was manufactured and the bonding surface area S was varied.

As is clear from FIG. 4, the ESR damping increases as the bonding surface area S increases. The ESR value also varies significantly even when the bonding surface area S is the same. As opposed to this, it can be seen that in the case where S is less than 0.150 mm², the ESR value does not vary, and the ESR is low and stable. In other words, it can be seen that with the quartz vibrating device 1 having an oscillation frequency of 24 MHz, ESR damping can be suppressed by setting the bonding surface area S to less than 0.150 mm².

Figure 5:
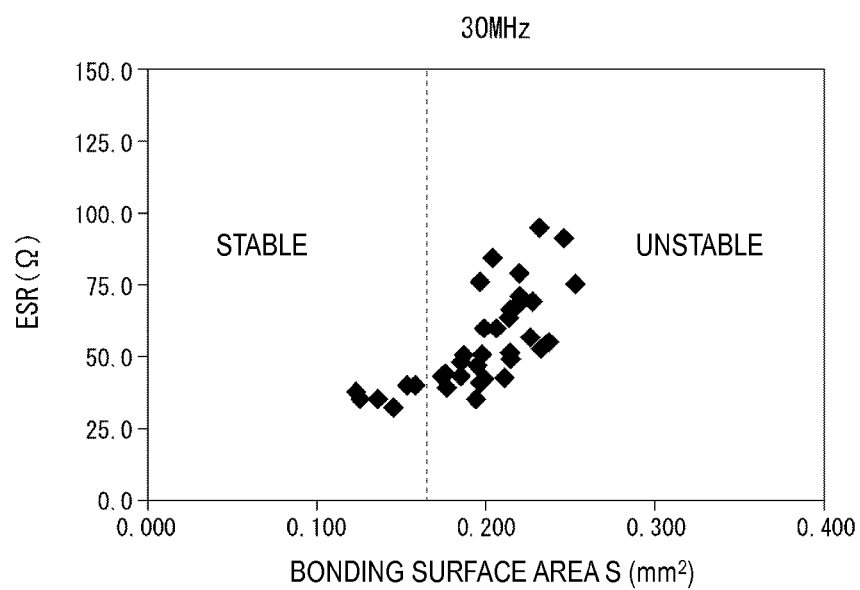
FIG. 5 is a diagram illustrating a relationship between a bonding surface area S and an equivalent series resistance ESR in a quartz vibrating device having an oscillation frequency in a 30 MHz band.

FIG. 5 is a diagram illustrating changes in ESR when the bonding surface area S is also varied for the quartz vibrating device 1 having an oscillation frequency of 30 MHz. As is clear from FIG. 5, in the case where the oscillation frequency is 30 MHz, the bonding surface area S may be set to less than 0.16 mm².

Figure 6:
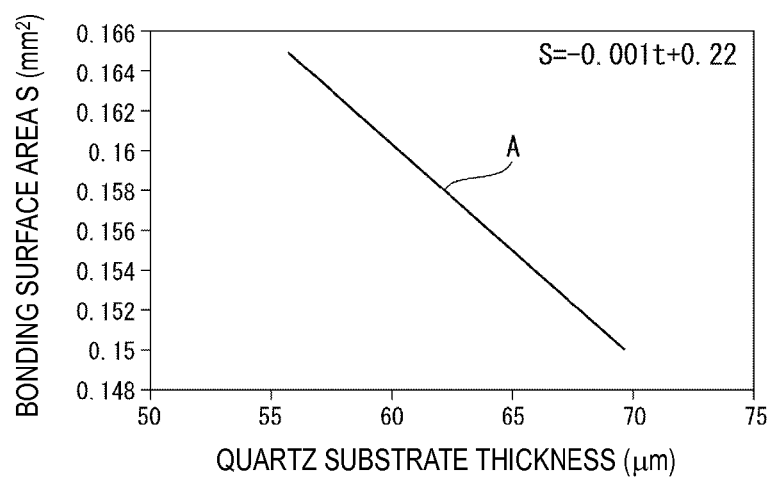
FIG. 6 is a diagram illustrating a relationship between a thickness t of a quartz substrate and a bonding surface area S in suppressing ESR damping.

In addition to the results illustrated in FIG. 4 and FIG. 5, the inventors of the present invention also examined a relationship between the bonding surface area S and ESR damping when further varying the oscillation frequency. The results are illustrated in FIG. 6. A straight line A in FIG. 6 corresponds to S=−0.001t+0.22. It was found that when the bonding surface area S is smaller than the straight line A, ESR damping can be effectively suppressed in the same manner as the stable regions in FIG. 4 and FIG. 5. Accordingly, in the present invention, it is necessary to employ a range in which S (mm²)≤−0.001t+0.22. The thickness t of the quartz substrate is determined by the oscillation frequency, and thus in the case of a 24 MHz quartz vibrator, t is 70 μm. On the other hand, t is 55 μm in a quartz vibrator whose oscillation frequency is 30 MHz. Accordingly, the thickness t of the quartz substrate is a value determined in accordance with the oscillation frequency of the quartz vibrator 11.

Note that the frequency constant of a quartz substrate formed from an AT cut quartz is 1670 MHz·μm. The relationship in the aforementioned formula S≤−0.001t+0.22 is based on the frequency constant of an AT cut quartz.

As described above, the bonding surface area S is smaller than −0.001t+0.22, and thus ESR damping can be effectively suppressed.

The quartz substrate 14 is, as described above, formed from an AT cut quartz substrate, and the lengthwise direction corresponds to the X-axis direction of the quartz. In the present embodiment, the quartz vibrator 11 is supported in a cantilever state at one end side in the lengthwise direction thereof, or in other words, is supported on a short side thereof. Accordingly, the mechanical support creates restrictions that have a great influence. However, according to the present invention, the stated bonding surface area S is within a specific range, and thus the influence of such vibration restrictions can be effectively suppressed. In other words, ESR damping can be effectively suppressed.

Note that as illustrated in FIG. 1, in the quartz vibrating device 1, a cap 21 whose lower area is open is affixed to the top surface of the case board 2 so as to enclose the quartz vibrator 11. This affixing can be carried out using a suitable adhesive such as an epoxy resin-based adhesive. The cap 21 is formed from a metal, and has a shape in which a lower area thereof is open. Accordingly, in the quartz vibrating device 1, a package is formed using the cap 21, and thus the device can be miniaturized. However, in the present invention, the quartz vibrator 11 may be sealed using another package material instead of the cap 21.

REFERENCE SIGNS LIST

1 . . . quartz vibrating device
2 . . . case board
3 . . . first mount electrode
4 . . . second mount electrode
5 . . . wire electrode
6 . . . first outer electrode
7 . . . wire electrode
8 . . . second outer electrode
9 . . . dummy electrode
10 . . . dummy electrode
11 . . . quartz vibrator
12 . . . first conductive adhesive layer
13 . . . second conductive adhesive layer
14 . . . quartz substrate
14a . . . long side
14b . . . long side
14c . . . short side
14d . . . short side
15 . . . first exciting electrode
16 . . . second exciting electrode
17 . . . extension electrode
18 . . . first terminal electrode
19 . . . extension electrode
20 . . . second terminal electrode
21 . . . cap

The invention claimed is:

1. A quartz vibrating device comprising:
a case board;
first and second mount electrodes on a surface of the case board, each of the first and second mount electrodes having a conductive adhesive mount area that does not include a recess on a surface thereof;
a quartz vibrator mounted upon the case board and formed of an AT cut quartz substrate; and
a plurality of conductive adhesive layers that electrically connect the quartz vibrator to the first and second mount electrodes and support the quartz vibrator in a cantilever state, each conductive adhesive layer of the plurality of conductive adhesive layers being positioned on a respective conductive adhesive mount area of the first and second mount electrodes,
wherein a total S (mm²) of bonding surface areas of portions bonding the quartz vibrator to the case board by the plurality of conductive adhesive layers is in a range of S≤−0.001t+0.22 when a thickness of the quartz substrate is t (μm).

2. The quartz vibrating device according to claim 1, wherein the plurality of conductive adhesive layers are first and second conductive adhesive layers that electrically connect the quartz vibrator to the first and second mount electrodes, respectively.

3. The quartz vibrating device according to claim 1, wherein the quartz vibrator is supported in the cantilever state at one end side in a lengthwise direction of the quartz substrate, and the lengthwise direction corresponds to an X-axis direction of the quartz.

4. The quartz vibrating device according to claim 1, wherein the plurality of conductive adhesive layers are a resin-based adhesive having a resin and a conductive material dispersed throughout the resin.

5. The quartz vibrating device according to claim 4, wherein the resin is an epoxy resin.

6. The quartz vibrating device according to claim 5, wherein the conductive material is a metal powder.

7. The quartz vibrating device according to claim 4, wherein the resin is a synthetic resin.

8. The quartz vibrating device according to claim 4, wherein the conductive material is a metal powder.

9. The quartz vibrating device according to claim 1, wherein the quartz vibrator includes a first exciting electrode on a first surface of the quartz substrate, a second exciting electrode on a second surface so as to overlap with the first exciting electrode, and first and second terminal electrodes electrically connected to the first and second exciting electrodes, respectively, and provided on the second surface of the quartz substrate.

10. The quartz vibrating device according to claim 9, wherein the first exciting electrode is in a center of the first surface and the second exciting electrode is in a center of the second surface.

11. The quartz vibrating device according to claim 1, wherein S is less than 0.150 mm$^2$.

12. The quartz vibrating device according to claim 1, wherein S is less than 0.160 mm$^2$.

13. The quartz vibrating device according to claim 1, further comprising a cap affixed to the surface of the case board so as to enclose the quartz vibrator.

* * * * *